United States Patent
Sekine (10) Patent No.: US 6,831,367 B2
(45) Date of Patent: Dec. 14, 2004

(54) SEMICONDUCTOR DEVICE AND METHOD OF MANUFACTURING THE SAME

(75) Inventor: Makoto Sekine, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/322,590

(22) Filed: Dec. 19, 2002

(65) Prior Publication Data

US 2004/0061238 A1 Apr. 1, 2004

(30) Foreign Application Priority Data

Sep. 30, 2002 (JP) .................................. 2002-287364

(51) Int. Cl.[7] .............................................. H01L 23/48
(52) U.S. Cl. ..................... 257/774; 257/774; 257/685
(58) Field of Search ............................... 257/774, 778, 257/698, 737, 738, 723; 361/414; 156/643

(56) References Cited

U.S. PATENT DOCUMENTS 5,034,091 A * 7/1991 Trask et al. .................... 216/18
5,161,093 A * 11/1992 Gorczyca et al. ........... 361/795
6,013,948 A * 1/2000 Akram et al. ............... 257/698

FOREIGN PATENT DOCUMENTS

| JP | 10-223833 | 8/1998 |
|---|---|---|
| JP | 2001-94041 | 4/2001 |

OTHER PUBLICATIONS

Hayasaka et al., U.S. patent application No. 09/377,486, filed Aug. 20, 1999, Multi–Chip Semiconductor Device, CHIP Therefor and Method of Formation Thereof.

* cited by examiner

Primary Examiner—David Nelms
Assistant Examiner—Thinh T Nguyen
(74) Attorney, Agent, or Firm—Finnegan, Henderson, Farabow, Garrett & Dunner, L.L.P.

(57) ABSTRACT

A semiconductor device comprises a semiconductor substrate having semiconductor elements integrally formed therein, a wiring layer formed on the surface of the semiconductor substrate, and a conductive connecting plug formed in a through-hole extending through the semiconductor substrate, wherein the connecting plug has a region whose cross section parallel to the upper surface of the semiconductor substrate has an area smaller than the area of each of upper and lower surfaces of the connecting plug.

18 Claims, 8 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2002-287364, filed Sep. 30, 2002, the entire contents of which are incorporated herein by reference.

BACKGROUND OF THE INVENTION

1. Field of the Invention

The present invention relates to a semiconductor device having a plug formed in a through-hole extending through a semiconductor substrate and a method of manufacturing the semiconductor device.

2. Description of the Related Art

In recent years, a large-scale integrated circuit chip prepared by integrating a large number of transistors, resistors, capacitors, etc., on a semiconductor substrate in a manner to form an electric circuit is used as an important part of computers or communication equipment. Therefore, the performance of the entire equipment is greatly dependent on the performance of the chip.

On the other hand, also proposed is a so-called multi-chip semiconductor device using a plurality of chips for improving the performance of the entire equipment. In recent years, proposed as a multi-chip semiconductor device is the technology described below. Specifically, a semiconductor chip is provided with a connecting plug made of a conductive material and formed in a through-hole extending through an interlayer insulating film and a semiconductor substrate. The semiconductor chip is electrically connected to another semiconductor chip by using the connecting plug noted above.

Figure 7:
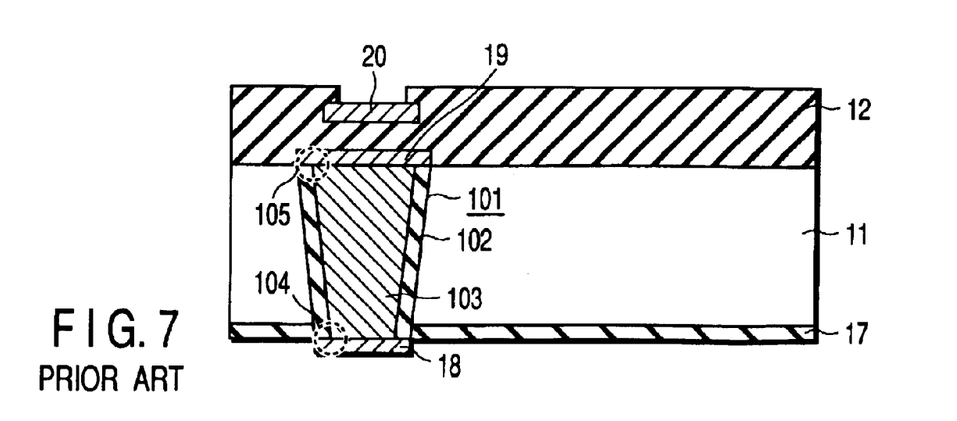
FIG. 7 is a cross-sectional view showing the construction of a conventional multi-chip semiconductor device.

FIG. 7 is a cross-sectional view showing the construction of a conventional semiconductor chip provided with the connecting plug noted above. In the semiconductor chip shown in FIG. 7, an actual through-hole 101 is generally formed by a reactive ion etching method (RIE). In this case, the sidewall of the through-hole 101 is generally formed forward tapered shape as shown in FIG. 7. It has been found, however, that, in a connecting plug 103 formed by using the through-hole 101 whose sidewall is formed forward tapered shape, a crack or peel is generated in connecting portions 104, 105 of the connecting plug 103 with upper and lower barrier metal layers 18, 19, respectively and, thus, a defective connection tends to take place. Incidentally, FIG. 7 also shows a multi-layered wiring layer 12, a protective insulating layer 17, a pad 20 and a sidewall insulating film 102.

What should be noted is that various kinds of stress are generated by the differences in, for example, the thermal expansion coefficient, the brittleness and Young's modulus between the chip material such as Si, quartz or various resins in the case of a substrate and the connecting plug buried in the through-hole 101. It has been found that, where the stress is generated, a crack tends to take place in, particularly, a corner 104 on the back surface of the semiconductor chip so as to bring about a defective electrical connection. It has also been found that a defective electrical connection also takes place in a corner 105 on the upper portion.

As described above, when it comes to a semiconductor chip provided with a connecting plug formed in a through-hole formed forward tapered shape and extending through a substrate, a serious problem is generated that a defective electrical connection is brought about by the stress exerted between the plug and the electrode formed on the lower surface of the plug.

BRIEF SUMMARY OF THE INVENTION

According to a first aspect of the present invention, there is provided a semiconductor device, comprising a semiconductor substrate having semiconductor elements integrally formed therein, a wiring layer formed on the surface of the semiconductor substrate, and a conductive connecting plug formed in a through-hole extending through the semiconductor substrate, wherein the upper and lower surfaces of the connecting plug are parallel to the upper surface of the semiconductor substrate, and the connecting plug has a region whose cross section parallel to the upper surface of the semiconductor substrate has an area smaller than the area of each of the upper and lower surfaces of the connecting plug.

According to a second aspect of the present invention, there is provided a semiconductor device, comprising a semiconductor substrate having semiconductor elements integrally formed therein, a wiring layer formed on the surface of the semiconductor substrate, a conductive connecting plug formed in a through-hole extending through the semiconductor substrate, and a first conductive layer formed on the connecting plug on the side of the back surface of the semiconductor substrate, wherein an interface between the connecting plug and the first conductive layer forms an acute angle with the side surface of the connecting plug connected to the interface between the connecting plug and the first conductive layer.

According to a third aspect of the present invention, there is provided a semiconductor device having a plurality of semiconductor chips stacked one upon the other, wherein at least one of the semiconductor chips comprises a semiconductor substrate having semiconductor elements integrally formed therein, a wiring layer formed on the surface of the semiconductor substrate, and a conductive connecting plug formed in a through-hole extending through the semiconductor substrate, and wherein the upper and lower surfaces of the connecting plug are parallel to the upper surface of the semiconductor substrate, and the connecting plug has a region whose cross section parallel to the upper surface of the semiconductor substrate has an area smaller than the area of each of the upper and lower surfaces of the connecting plug.

According to a fourth aspect of the present invention, there is provided a semiconductor device having a plurality of semiconductor chips stacked one upon the other, wherein at least one of the semiconductor chips comprises a semiconductor substrate having semiconductor elements integrally formed therein, a wiring layer formed on the surface of the semiconductor substrate, a conductive connecting plug formed in a through-hole extending through the semiconductor substrate, and a first conductive layer formed on the connecting plug on the side of the back surface of the semiconductor substrate, and wherein an interface between the connecting plug and the first conductive layer forms an acute angle with the side surface of the connecting plug connected to the interface between the connecting plug and the first conductive layer.

Further, according to a fifth aspect of the present invention, there is provided a method of manufacturing a semiconductor device, comprising selectively etching a semiconductor substrate from the side of the front surface so as to form a first hole having a sidewall forward tapered; forming a second hole connected to the lower portion of the first hole and having a sidewall inverse tapered in the portion connected to the first hole; burying a conductive material in the first and second holes; and exposing the buried conductive material to the back surface of the semiconductor substrate so as to form a connecting plug made of the conductive material and extending through the semiconductor substrate.

DETAILED DESCRIPTION OF THE INVENTION

Some embodiments of the present invention will now be described with reference to the accompanying drawings.

(First Embodiment)

Figure 1:
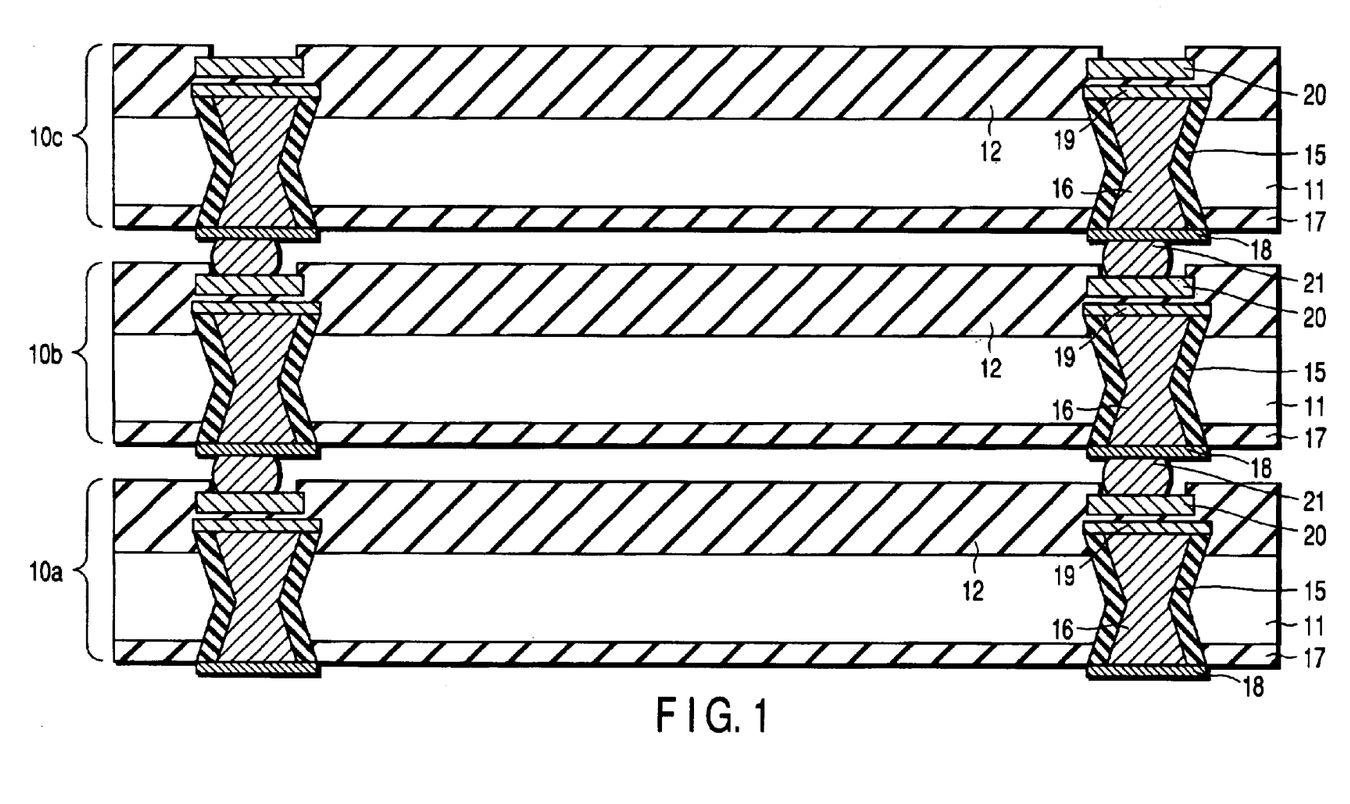
FIG. 1 is a cross-sectional view showing the construction of a multi-chip semiconductor device according to a first embodiment of the present invention.
Figure 2:
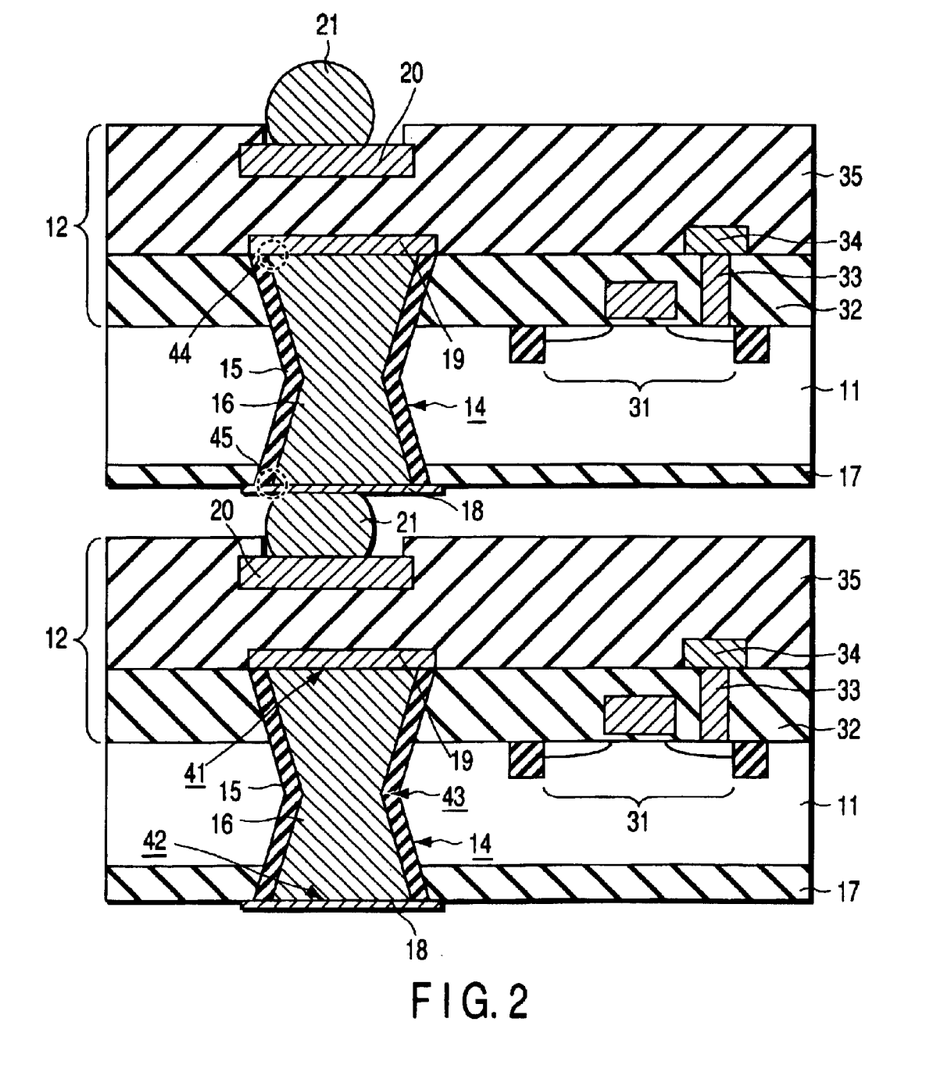
FIG. 2 is a cross-sectional view showing the construction of a semiconductor chip according to the first embodiment of the present invention.

FIG. 1 is a cross-sectional view showing the construction of a multi-chip semiconductor device according to the first embodiment of the present invention. Also, FIG. 2 is a cross-sectional view showing the construction of a semiconductor chip constituting the multi-chip semiconductor device according to the first embodiment of the present invention.

As shown in FIG. 1, the multi-chip semiconductor device comprises three semiconductor chips 10a, 10b, and 10c, which are stacked one upon the other in the order mentioned. As shown in FIG. 2, each of the semiconductor chips 10a, 10b and 10c comprises a silicon substrate 11 having semiconductor elements 31 formed integrally on the surface, a multi-layered wiring layer 12, and a connecting plug 16.

The multi-wiring layer 12 comprises a first interlayer insulating film 32, a contact plug 33, a first wiring layer 34 and an upper wiring layer 35. The first interlayer insulating film 32 is formed on the silicon substrate 11 in a manner to cover the semiconductor elements 31. The contact plug 33 is buried in a contact hole formed in the first interlayer insulating film 32. Further, the first wiring layer 34 is electrically connected to the semiconductor elements 31 via the contact plug 33.

A second wiring layer electrically connected to the first wiring layer 34 through a via plug (not shown) is formed in the upper layer wiring layer 35. Incidentally, it is possible for the number of wiring layers to be three or more. The semiconductor elements 31 are connected to form a prescribed relationship with, for example, the connecting plug 16 and a pad 20 formed within the upper wiring layer 35 by a wiring and a plug.

The connecting plug 16 is formed within a through-hole 14 extending through the first interlayer insulating film 32 and the silicon substrate 11 such that a sidewall insulating film 15 is interposed between the connecting plug 16 and the sidewall of the through-hole 14. Incidentally, it is possible for the connecting plug 16 to be formed in a manner to extend through the silicon substrate 11 alone. The connecting plug 16 is formed outside the element-forming region. However, it is possible for the connecting plug 16 to be formed inside the element-forming region. A barrier metal layer 18 is formed on a lower surface 42 of the connecting plug 16. Also, a barrier metal layer 19 is formed on an upper surface 41 of the connecting plug 16. However, an insulating film can be disposed instead of a barrier metal layer 19 as a barrier layer, and the connecting plug 16 can be connected to a via plug through a hole formed in the insulating film as the barrier layer.

The upper surface 41 and the lower surface 42 of the connecting plug 16 are parallel to the surface of the silicon substrate 11, and the connecting plug 16 has a region having a cross-sectional area parallel to the upper surface of the silicon substrate 11 and smaller than the area of each of the upper surface 41 and the lower surface 42 of the connecting plug 16. To be more specific, the area of each of the upper surface 41 and the lower surface 42 of the connecting plug 16 is larger than the cross-sectional area, which is parallel to the upper surface of the semiconductor substrate 11, of a central portion 43 of the connecting plug 16. In other words, the sidewall of the connecting plug 16 extending from the upper surface 41 to the central portion 43 has forward tapered shape, and the sidewall of the connecting plug 16 extending from the central portion 43 to the lower surface 42 has invertedly tapered shape.

Where a plurality of chips are stacked one upon the other to form a stacked semiconductor device, the thickness of each chip is decreased in general to scores of microns to hundreds of microns in order to decrease the thickness of the stacked semiconductor device that is finally formed. Elements and wiring layers made of various materials are stacked on both surfaces of a thin chip. The complex stress generated by the stacked elements and the wiring layers causes the thin chip to be warped in some cases. The stacked chips generate different stresses, and when the chips are warped, the warping manner is nonuniform.

It follows that, when such chips are stacked one upon the other, the stress is concentrated in the connecting portions of the chips, i.e., the connecting portions between the connecting plug 16 and the connecting members such as the upper and lower electrodes and the solder bump. The stress concentration causes occurrence of a crack, which is the greatest cause of defective electrical connection. Particularly, defective electrical connection is generated in the contact regions between the connecting plug 16 and the upper barrier metal layer 19 and between the connecting plug 16 and lower barrier metal layers 18.

On the other hand, where the connecting plug 16 has a region having a cross-sectional area parallel to the upper surface of the semiconductor substrate 11 and smaller than the area of each of the upper surface and the lower surface of the connecting plug 16, it is possible to suppress the force in the vertical direction of the connecting plug 16 generated by the stress so as to moderate the stress concentration and, thus, to suppress the occurrence of a defective electrical connection.

Also, in a portion 45 where the connecting plug 16 is connected to the barrier metal layer 18, the sidewall of the connecting plug 16 forms an acute angle with the interface between the connecting plug 16 and the barrier metal layer 18. Similarly, in a portion 44 where the connecting plug 16 is connected to the barrier metal layer 19, the sidewall of the connecting plug 16 forms an acute angle with the interface between the connecting plug 16 and the barrier metal layer 19. The particular construction permits producing high resistance characteristics even in the case where a stress to peel off the bond is concentrated between the connecting plug 16 and the barrier metal layer 18 or between the connecting plug 16 and the barrier metal layer 19. Incidentally, since the stress tends to be concentrated between the connecting plug 16 and the lower metal barrier metal layer 18, it suffices for the sidewall of the connecting plug 16 to form an acute angle with the interface between the connecting plug 16 and the barrier metal layer 18 in at least the connecting portion 45 between the connecting plug 16 and the barrier metal layer 18.

The pad 20 is formed within the upper wiring layer 35 included in each of the chips 10a, 10b and 10c. Also, a protective insulating film 17 made of $SiO_2$ is formed on the back surface of the silicon substrate 11 on the side opposite to the pad 20 in each of the chips 10a, 10b and 10c. The protective insulating film 17 is formed in a region other than the connecting plug 16.

The connecting plug 16 included in the chip 10b is electrically connected to the pad 20 formed in the multi-wiring layer 12 included in the chip 10a via a solder bump 21. By this electrical connection, the chip 10a and the chip 10b are electrically connected to each other.

Likewise, the connecting plug 16 included in the chip 10 is electrically connected via the solder bump 21 to the pad 20 formed in the multi-wiring layer 12 included in the chip 10b. By this electrical connection, the chip 10b and the chip 10c are electrically connected to each other. Incidentally, it is possible to use a bump other than the solder bump 21 or another connecting member for the electrical connection between the different chips. For example, it is possible to use a gold bump or a barrier metal layer for the electrical connection between the different chips. It is also possible for the connecting plug to be connected directly to the connecting plug of the other chip that is to be stacked.

Figure 3A:
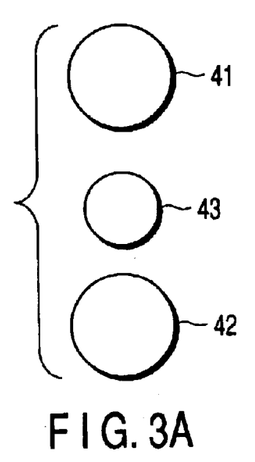
FIGS. 3A to 3E show the cross-sectional shapes of a connecting plug included in a multi-chip semiconductor device according to the first embodiment of the present invention.
Figure 3B:
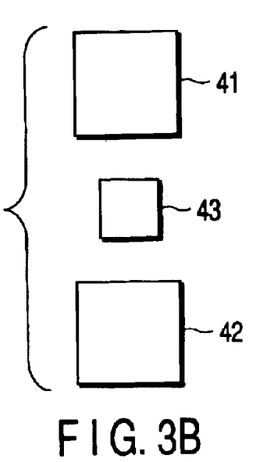
Figure 3C:
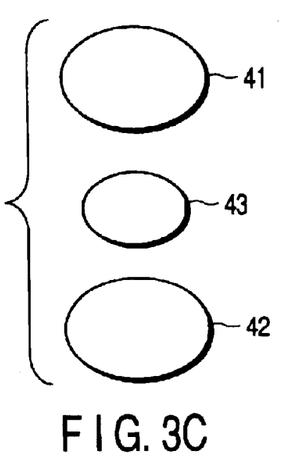
Figure 3D:
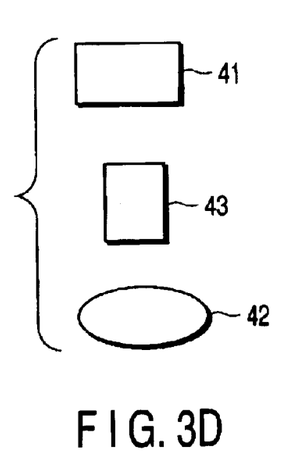
Figure 3E:
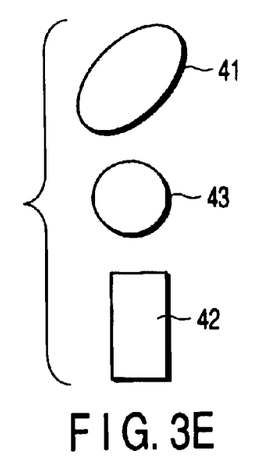

FIGS. 3A to 3E exemplify the cross-sectional shapes of the connecting plug 16. FIG. 3A exemplifies circular cross-sectional shapes of the connecting plug 16. As shown in FIG. 3A, the upper surface 41 and the lower surface 42 of the connecting plug 16 have substantially the same diameter. On the other hand, the cross-sectional area of the central portion 43 of the connecting plug 16 is smaller than each of the areas of the upper surface 41 and the lower surface 42. FIG. 3B covers the case where the connecting plug 16 has a rectangular cross-sectional shape. As in the case where the connecting plug 16 has a circular cross-sectional shape, the cross-sectional area in each of the upper surface and the lower surface of the connecting plug 16 has an area larger than the cross-sectional area in the central portion of the connecting plug 16. Also, it is possible for the connecting plug 16 to have an elliptical cross-sectional shape as shown in FIG. 3C. Further, it is possible for the upper surface 41, the lower surface 42 and the cross-section in the central portion 43 of the connecting plug 16 to have different shapes as shown in FIGS. 3D and 3E. In other words, it is possible for the connecting plug 16 to have an optional cross-sectional shape.

A method of manufacturing a semiconductor chip comprising a connecting plug of the particular shape described above will now be described. FIGS. 4A to 4K are cross-sectional views collectively showing a method of manufacturing a semiconductor chip according to a first embodiment of the present invention.

Figure 4A:
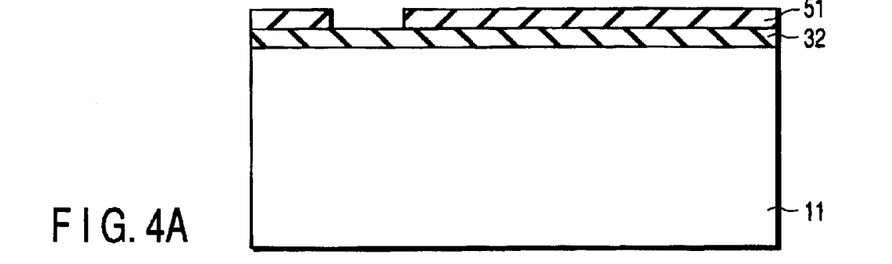
FIGS. 4A to 4K are cross-sectional views collectively showing the manufacturing method of a semiconductor chip according to the first embodiment of the present invention.

As shown in FIG. 4A, prepared is a wafer, i.e., a silicon substrate 11 having a semiconductor element (not shown) formed therein and also having a first interlayer insulating film 32 formed on the outermost surface. Then, a silicon oxide film (mask layer) 51 is formed in a thickness of 1 $\mu$m on the first interlayer insulating film 32, followed by patterning the silicon oxide film 51 so as to form an opening in which a through-plug is to be formed. The mask layer 51 is formed of a material widely differing in the etching rate from the first interlayer insulating film 32.

Figure 4B:
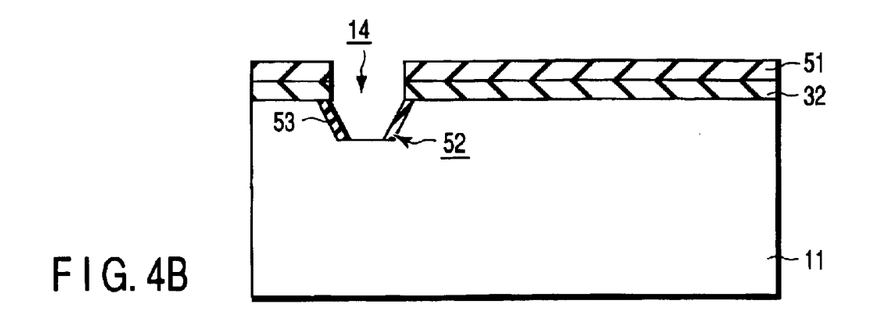

As shown in FIG. 4B, a RIE (anisotropic etching) is applied with the silicon oxide film 51 having the opening formed therein used as a mask so as to successively etch the first interlayer insulating film 32 and the silicon substrate 11, thereby forming a first hole 52 constituting a part of a through-hole 14. In this step, a mixed gas consisting of $SF_6$ gas and $O_2$ gas is used as the etching gas.

The RIE is performed under the conditions that the sidewall of the first hole 52 is formed forward tapered shape. The formation of the first hole 52 is once stopped when the bottom of the first hole 52 is positioned at substantially half the depth of the through-hole 14 that is to be formed finally.

In the etching step, a layer of the reaction product between the etched material and oxygen, i.e., a sidewall protective film 53, is formed on the wall defining the first hole 52. In accordance with growth of the sidewall protective film 53, the sidewall of the first hole 52 is formed to be forward tapered shape. It follows that the thick sidewall protective film 53 is formed at the stage when the tapered etching in the upper portion is finished. On the other hand, silicon is of course exposed at the bottom surface of the through-hole 14 at which the etching proceeds.

Figure 4C:
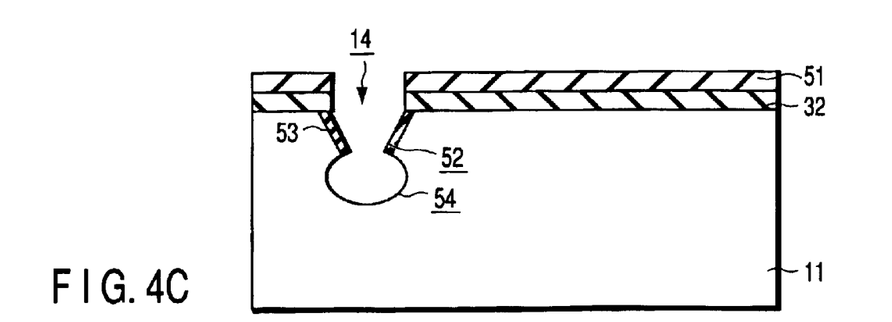

As shown in FIG. 4C, the silicon substrate 11 is etched by changing the etching conditions so as to form a second hole 54 below the first hole 52. The etching conditions are changed from the conditions under which an anisotropic etching is performed to the conditions under which an isotropic etching performed. To be more specific, in the case of using a mixed gas of $SF_6$ and $O_2$ as an etching gas, the flow rate ratio of $SF_6$ is increased and, at the same time, the gas pressure is increased so as to perform the isotropic etching.

In the isotropic etching process, the sidewall protective film 53 is formed on the surface of the wall defining the first hole 52 and, thus, the sidewall of the second hole 54 is kept forward tapered shape. Also, that portion of the sidewall of the second hole 54 which is positioned contiguous to the first hole 52 is formed invertedly tapered shape.

The second hole 54 is formed somewhat deeper than the depth of the through-hole 14 that is to be formed finally. In the case of preparing a chip having a thickness of 60 $\mu$m, the bottom portion of the second hole 54 is formed in a depth of a bout 65 $\mu$m. The first hole 52 and the second hole 54 collectively form the through-hole 14.

Figure 4D:
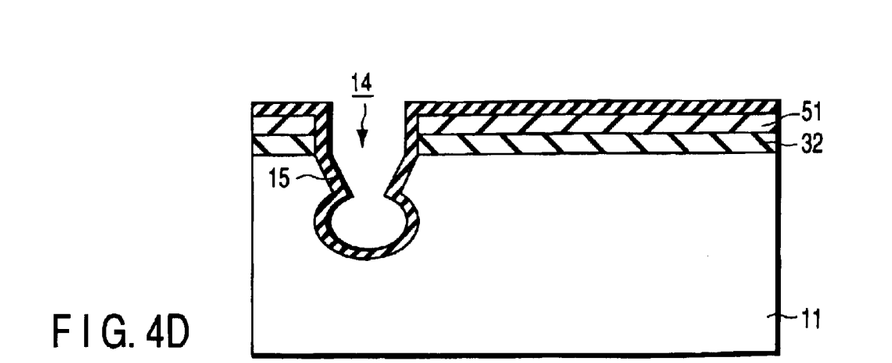

As shown in FIG. 4D, an $SiO_2$ film having a thickness of about 100 nm and an $Si_3N_4$ film having a thickness of about 100 nm are successively deposited on the entire surface so as to form a sidewall insulating film 15.

Figure 4E:
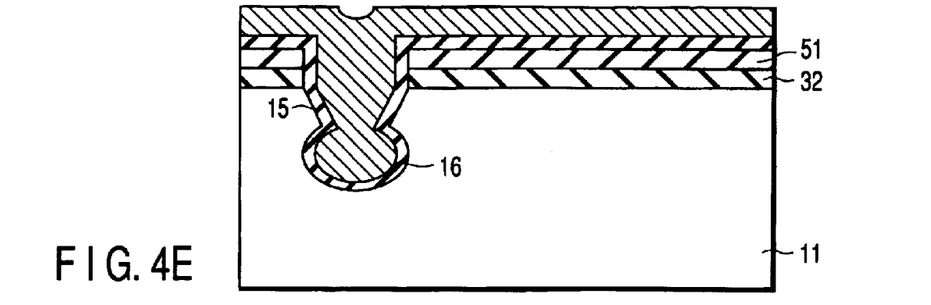

As shown in FIG. 4E, a metal film 16 constituting a connecting plug is deposited so as to bury the metal film 16 in the through-hole 14. The metal film 16 is formed of, for example, W, Mo, Ni, Ti, a metal silicide thereof, or Cu. The metal film 16 is formed by, for example, a CVD method, a sputtering method, or a plating method. In the case of employing the sputtering method, it is difficult to bury sufficiently the metal film 16 in the lower portion, which is formed isotropically, of the through-hole 14. Therefore, it is desirable to employ the CVD method or the plating method for forming the metal film 16. It should be noted, however, that it is possible to expose the connecting plug 16 from the back surface, followed by filling the resultant void.

Figure 4F:
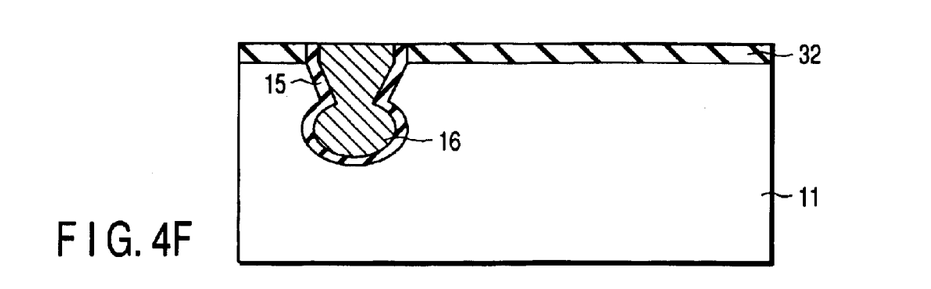

As shown in FIG. 4F the metal film 16, the sidewall insulating film 15, and the silicon oxide film 51 on the first interlayer insulating film 32 are successively removed by the CMP method, the etch back method or the electrolytic polishing method until the surface of the first interlayer insulating film 32 is exposed to the outside. As a result, the metal film (connecting plug) 16 alone is buried in the through-hole 14.

Figure 4G:
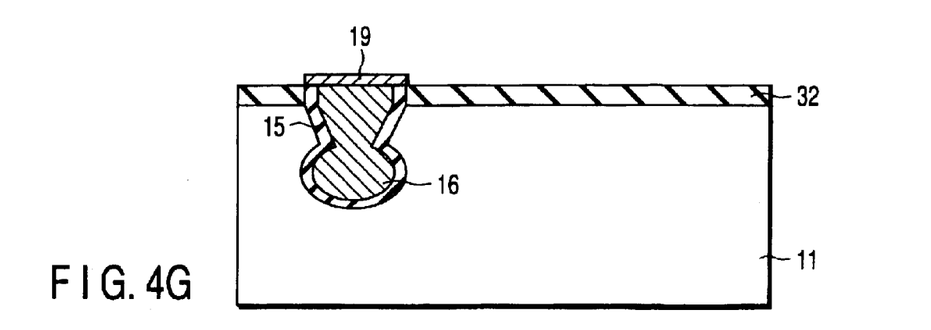

As shown in FIG. 4G, a barrier metal material is deposited on the first interlayer insulating film 32 and patterned, forming the barrier metal layer 19 covering the surface of the connecting plug 16.

Figure 4H:
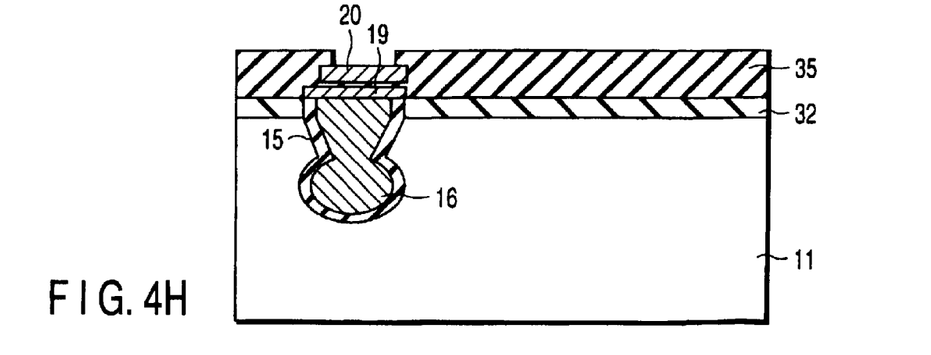

As shown in FIG. 4H, the upper wiring layer 35 is formed on the silicon substrate 11. The layer 35 and the first interlayer insulating film 32 constitute a multi-wiring layer. The upper wiring layer 35 comprises metal wiring (a wiring layer), an interlayer insulating film, and a plug. A trench is made in the upper wiring layer 35, thereby exposing the pad 20.

Figure 4I:
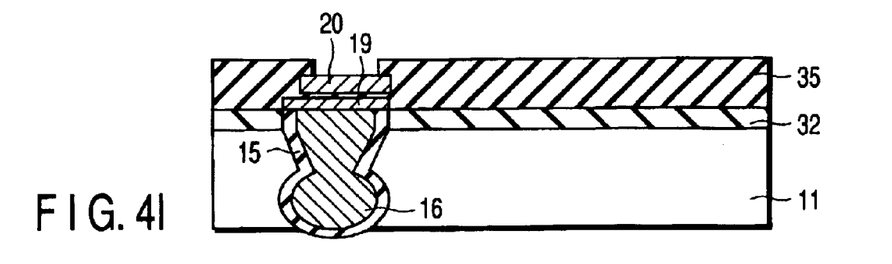

As shown in FIG. 4I, the silicon substrate 11 is selectively removed from the back surface opposite to the surface to which the processing to form the hole 14 was applied. The silicon substrate 11 is selectively removed until the bottom portion of the hole 14 is exposed to the outside by, for example, a CMP method, a chemical polishing method, a mechanical polishing method, a wet etching method, a plasma etching method, a gas etching method, or a combination of some of these methods.

If the selective removal of the silicon substrate 11 is performed under the conditions that permit ensuring a selectivity ratio between the silicon substrate 11 and the insulating film 15, the selective removal can be automatically finished in a manner to have the insulating film 15 left unremoved. It should also be noted that, if the insulating film 15 is left unremoved in the bottom portion of the hole 14, it is possible to suppress the contamination of the silicon substrate 11 caused by the plug 16.

Figure 4J:
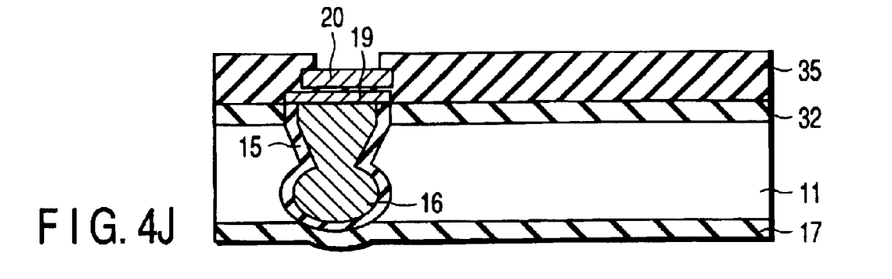

As shown in FIG. 4J, an $SiO_2$ film 17 is formed by a plasma CVD method on the entire back surface of the silicon substrate 11 on the side of the bottom portion of the hole 14. Incidentally, where a low temperature process is required, it is advisable to use a coated film such as an SOG (Spin On Glass) film in place of the $SiO_2$ film. Also, where it is desirable to diminish the stress received by the silicon substrate 11, it is advisable to use an organic film such as a polyimide film.

Figure 4K:
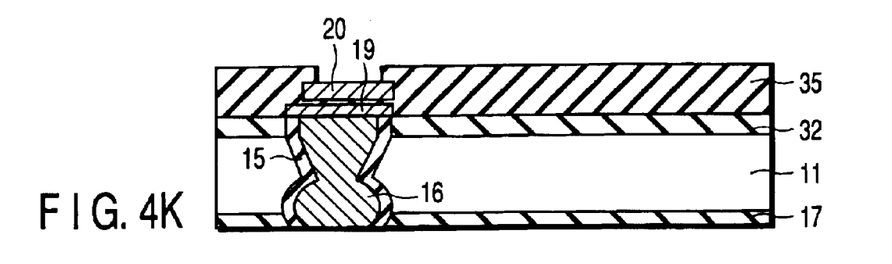

As shown in FIG. 4K, the $SiO_2$ film 17 and the sidewall insulating film 15 are polished by the CMP method until the connecting plug 16 is exposed to the outside. As a result, the connecting plug 16 is buried in the through-hole 14 and the periphery of the connecting plug 16 is covered with the side insulating film 15.

According to the first embodiment of the present invention described above, it is possible to moderate the generation of the force pulling the connecting plug inward the substrate. Also, the stress concentration is unlikely to take place in the bonding portion between the connecting plug and the upper or lower barrier metal layer. As a result, it is possible to suppress the cracking and wire breakage generated by the various stresses in the connecting portion between the through-via and the upper or lower electrode or the bump, i.e., in the connecting portion where the problem of reliability is most likely to be generated in the multi-chip semiconductor device prepared by stacking semiconductor chips.

(Second Embodiment)

Figure 5A:
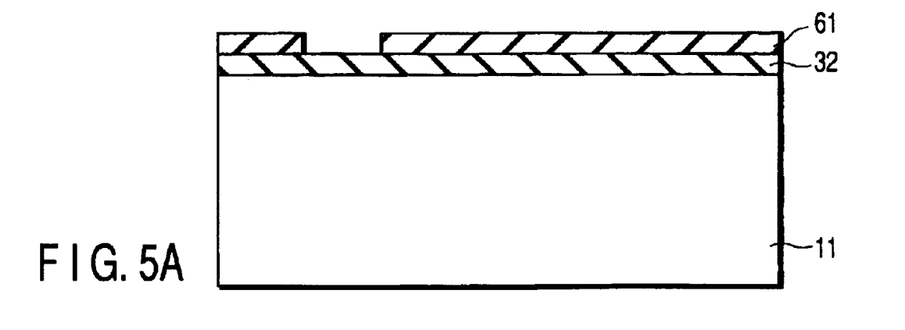
FIGS. 5A to 5C are cross-sectional views collectively showing the manufacturing method of a semiconductor chip according to a second embodiment of the present invention.
Figure 5B:
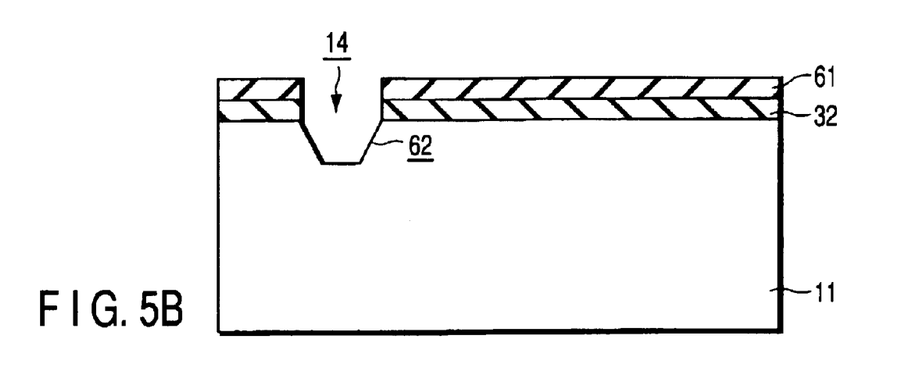
Figure 5C:
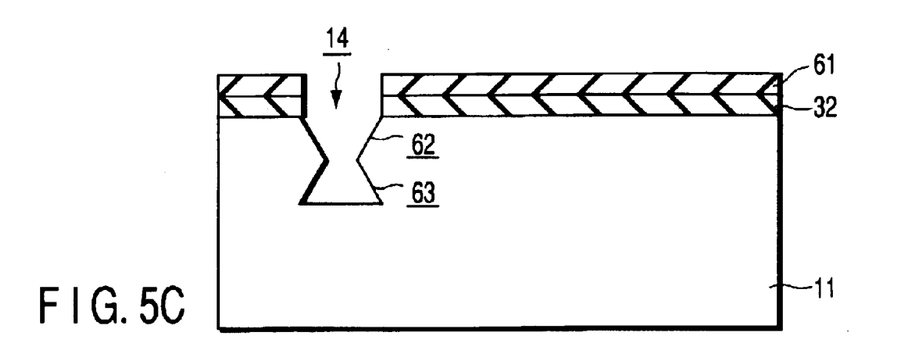

The second embodiment is directed to a method of forming a through-hole differing from the method in the first embodiment described above. FIGS. 5A to 5C are cross sectional views collectively showing a method of manufacturing a semiconductor chip according to the second embodiment of the present invention.

As shown in FIG. 5A, a silicon oxide film 61 having an opening is formed on the first interlayer insulating film 32. This step is equal to the step described previously with reference to FIG. 4A in conjunction with the first embodiment and, thus, the detailed description of this step is omitted.

In the next step, the first interlayer insulating film 32 and the silicon substrate 11 are successively etched through the opening of the silicon oxide film 61. Used in the etching step of the silicon substrate 11 is a method called BOSCH etching method using an induction coupling type plasma (ICP) apparatus. In this etching method, used are, for example, $C_4F_8$ gas as a depositing gas and $SF_6$ gas as an etching gas.

Concerning the process conditions, the gas pressure was set at 200 mTorr, the gas flow rate was set at 150 sccm, the source RF power was set at 800W, the bias RF power was set at 150W, and the electrode temperature was set at 20° C. Incidentally, the frequency for each of the source RF power and the bias RF power was set at 13.56 MHz. In the BOSCH etching method, the layer to be etched is alternately irradiated with a $C_4F_8$ plasma having depositing properties and with an $SF_6$ plasma having etching properties. Processing having a high directivity can be achieved by repeating the step of forming a deposited film on the entire wafer surface including the wall defining the hole and the step of removing the deposited film from the bottom portion of the hole that is to be etched, followed by etching silicon. Therefore, required are a control valve and a flow rate control system for switching the gases at high speed.

Also, it is possible to control optionally the tapering angle of the sidewall of the through-hole by adjusting the time and conditions of the deposition and the etching. For example, the sidewall of the through-hole is formed forward tapered shape if the etching time is short, and is formed invertedly tapered shape if the etching time is long. If the etching time is shortened in the technology of alternately repeating the deposition and the etching, the processing time of the entire through-hole is rendered long, which corresponds to the reduction in the average etching rate, so as to lower the productivity. However, it is possible to achieve the processing at the rate of at least 10 $\mu$m/min under the conditions given above. Also, since the deposited film is formed on the mask (silicon oxide film 61), too, the etching amount of the mask is suppressed so as to obtain a selectivity ratio of about 200 relative to the silicon substrate. It follows that it is possible to obtain the merit that a relatively deep through-hole can be formed by using a thin mask.

To be more specific, the silicon substrate 11 is processed under the conditions given above, with the combination of 2 seconds of the deposition time and 4 seconds of the etching time forming one cycle (6 seconds). The etching rate is about 18 μm/min. The etching is performed for 4 seconds in one cycle as described above. However, about 1 second is required for removing the film deposited on the bottom portion of the hole during the deposition treatment and, thus, the substantial etching time is about 3 seconds. It follows that the etching amount of the silicon substrate 11 in one cycle is about 0.9 μm. In the processing for 1 minute, the cycle of the etching and the deposition, which requires 6 seconds as described above, is repeated 10 times, with the result that formed is a hole having a depth of about 9 μm. It should be noted in this connection that it is impossible to remove completely the film deposited on the sidewall of the hole by 3 seconds of the substantial etching time in each cycle, with the result that the deposited film grows gradually on the sidewall of the hole. It follows that the sidewall of the first hole 62 formed under the conditions given above has forward tapered shape as shown in FIG. 5B. There are two reasons for the forward tapering in the sidewall of the first hole 62. The first reason is that the film deposited on the sidewall is thicker than the film deposited on the bottom portion of the first hole 62, and the second reason is that there is no ion bombardment on the sidewall in the etching step, though there is a slight ion bombardment on the bottom portion, with the result that the deposited film is etched with the F radical alone. The tapering angle in the sidewall of the first hole 62 under the conditions given above is about 85°. When 34 cycles of the processing requiring 204 seconds was performed, formed was the first through-hole 62 having forward tapered shape and having a depth of about 30.6 μm.

As shown in FIG. 5C, the process conditions are changed so as to form a second hole 63 having a sidewall formed invertedly tapered shape. The process conditions relating to the gases used and the RF power are equal to those described previously, and the switching time between the $C_4F_8$ gas and the $SF_6$ gas is changed. For example, the processing time with the $C_4F_8$ gas plasma having the depositing properties is set at 2 seconds, and the processing time with the $SF_6$ plasma having the etching properties is set at 6 seconds (one cycle of the deposition and the etching requiring 8 seconds). In the case of this switching time, about one second is also required for the removal of the film deposited on the bottom portion of the hole. Therefore, the silicon substrate 11 is etched by about 1.5 μm in the substantial etching time (5 seconds) in one cycle of the deposition and the etching. If the deposition-etching cycle is repeated 20 times (160 seconds), the silicon substrate 11 is etched by about 30 μm. In this case, the tapering angle in the sidewall of the second hole 63 was found to be about 96°, supporting that the etching tapered inverse had been achieved. This mechanism permits prolonging the etching time so as to remove substantially completely the deposited film on the sidewall of the hole by the etching for 6 seconds. Also, since the downward etching is performed under substantially the isotropic conditions that the etching proceeds both in the vertical direction and the lateral direction in substantially the same etching rate, the hole diameter is gradually expanded in the lateral direction.

By the method described above, it was possible to form a through-hole having a depth of about 60 μm and comprising the first hole 62 having the sidewall formed forward tapered shape and the second hole 63 having the sidewall formed inverse tapered shape.

The steps after formation of the through-hole including the central portion having a small cross-sectional area are equal to those described previously with reference to FIGS. 4D to 4K in conjunction with the first embodiment and, thus, the description thereof is omitted.

Figure 6A:
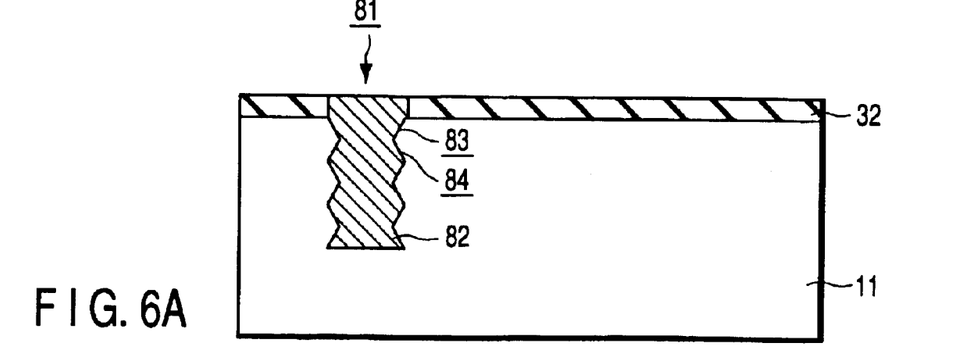
FIGS. 6A and 6B are cross-sectional views showing the construction of the semiconductor chip according to the second embodiment of the present invention.

Incidentally, it is possible to repeat the conditions for forming the sidewall tapered forward and the conditions for forming the sidewall tapered inverse a plurality of times. If these conditions are repeated, it is possible to form a through-hole 81 and a connecting plug 82, which are shaped as shown in FIG. 6a. In this case, each of the conditions for forming the sidewall tapered forward and the conditions for forming the sidewall tapered inverse is repeated three times.

As shown in FIG. 6A, a plurality of pairs of a sidewall section (first sidewall section) 83 that is formed forward tapered shape and a sidewall section (second sidewall section) 84 that is formed invertedly tapered shape and connected to the lower end of the sidewall section that is formed forward tapered shape are formed on the sidewall of the connecting plug 82. Incidentally, an insulating film formed on the sidewall section of the through-hole 81 is omitted in the drawing of FIG. 6A.

Figure 6B:
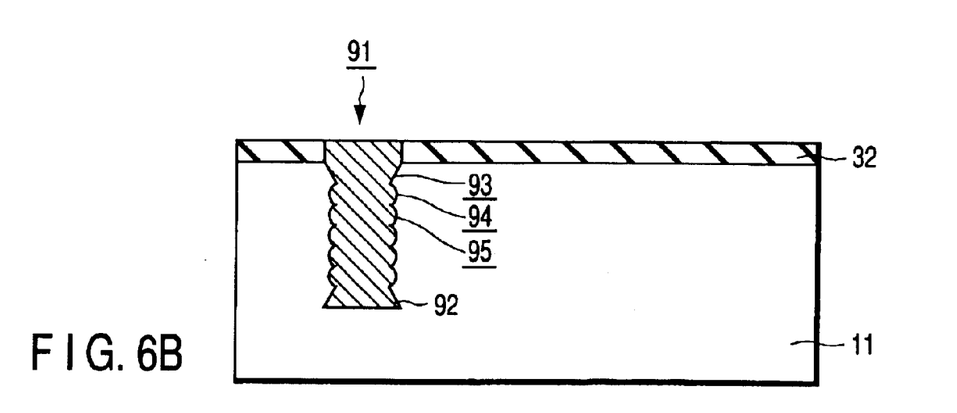

In addition to the taper etching technology described above, it is possible to form a through-hole 91 and a connecting plug 92, which are shaped as shown in FIG. 6B, by using an isotropic etching technology. The connecting plug 92 comprises a first sidewall section 93 that is formed forward tapered shape and a second sidewall section 94 that is shaped arcuate and connected to the lower end of the first sidewall section 93. In addition, a third sidewall section 95 that is shaped arcuate is formed below the second sidewall section 94. In this fashion, a plurality of sidewall sections that are shaped arcuate are connected to each other so as to form an irregular sidewall, and a sidewall section that is formed invertedly tapered shape is connected to the lowermost sidewall section that is shaped arcuate.

For forming the particular shape, an etching is performed by the BOSCH method by alternately supplying a plasma having the depositing properties and another plasma having isotropic etching properties. It should be noted, however, that the partial pressure of, for example, the $SF_6$ gas is set at 500 mTorr for performing the isotropic etching. Under this condition, it is possible to achieve a high etching rate, though there is no directivity. Further, there is a merit that the irradiating time of the plasma having the depositing properties can be shortened by increasing the pressure in forming the plasma having the depositing properties to 500 mTorr. In this etching, it is possible to achieve an average etching rate of about 30 μm/min.

The present invention is not limited to each of the embodiments described above and can be modified in working the invention in various fashions within the scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate having semiconductor elements integrally formed therein;
   a wiring layer formed on a surface of the semiconductor substrate;
   a conductive connecting plug formed in a through-hole extending through the semiconductor substrate;

a first conductive layer formed on the connecting plug on a side of a back surface of the semiconductor substrate; and a barrier layer formed on the connecting plug on a side of a front surface of the semiconductor substrate, wherein the connecting plug has a region whose cross section parallel to the upper surface of the semiconductor substrate has an area smaller than the area of each of the upper and lower surfaces of the connecting plug.

2. A semiconductor device according to claim 1, wherein the connecting plug has a first sidewall section having forward tapered shape and a second sidewall section that has invertedly tapered shape and connected to the lower end of the first sidewall section, and so that the cross-sectional area, which is parallel to the upper surface of the semiconductor substrate, of the connecting portion between the first sidewall section and the second sidewall section is smaller than the area of each of the upper surface and the lower surface of the connecting plug.

3. A semiconductor device according to claim 2, wherein the first sidewall section is formed by an anisotropic etching, and the second sidewall section is formed by an isotropic etching.

4. A semiconductor device according to claim 2, wherein the sidewall of the connecting plug has a plurality of pairs of the first sidewall section and the second sidewall section.

5. A semiconductor device according to claim 1, wherein the connecting plug has a first sidewall section that having forward tapered shape and a second sidewall section that has arcuate shape and connected to the lower end of the first sidewall section so that the cross-sectional area, which is parallel to the upper surface of the semiconductor substrate, of the connecting portion between the first sidewall section and the second sidewall section is smaller than the area of each of the upper surface and the lower surface of the connecting plug.

6. A semiconductor device according to claim 5, wherein the first and second sidewall sections are formed by a BOSCH method.

7. A semiconductor device according to claim 5, wherein the connecting plug further comprises a third sidewall section that has arcuate shape and connected to the lower end of the second sidewall section.

8. A semiconductor device according to claim 1, wherein an interface between the connecting plug and the conductive layer forms an acute angle with the side surface of the connecting plug connected to the interface between the connecting plug and the conductive layer.

9. A semiconductor device, comprising:

a semiconductor substrate having semiconductor elements integrally formed therein;

a wiring layer formed on a surface of the semiconductor substrate;

a conductive connecting plug formed in a through-hole extending through the semiconductor substrate;

a first conductive layer formed on the connecting plug on a side of a back surface of the semiconductor substrate; and a barrier layer formed on the connecting plug on a side of a front surface of the semiconductor substrate, wherein an interface between the connecting plug and the first conductive layer forms an acute angle with a side surface of the connecting plug connected to the interface between the connecting plug and the first conductive layer, and an interface between the connecting plug and the barrier layer forms an acute angle with the side surface of the connecting plug connected to the interface between the connecting plug and the barrier layer.

10. A semiconductor device having a plurality of semiconductor chips stacked one upon the other, wherein at least one of the semiconductor chips comprises:

a semiconductor substrate having semiconductor elements integrally formed therein;

a wiring layer formed on a surface of the semiconductor substrate;

a conductive connecting plug formed in a through-hole extending through the semiconductor substrate;

a first conductive layer formed on the connecting plug on a side of a back surface of the semiconductor substrate; and a barrier layer formed on the connecting plug on a side of a front surface of the semiconductor substrate, and wherein the connecting plug has a region whose cross section parallel to the upper surface of the semiconductor substrate has an area smaller than the area of each of the upper and lower surfaces of the connecting plug.

11. A semiconductor device according to claim 10, wherein the connecting plug comprises:

a first sidewall section having forward tapered shape; and a second sidewall section having invertedly tapered shape and connected to the lower end of the first sidewall section so that the cross-sectional area, which is parallel to the upper surface of the semiconductor substrate, of the connecting portion between the first sidewall section and the second sidewall section is smaller than the area of each of the upper surface and the lower surface of the connecting plug.

12. A semiconductor device according to claim 11, wherein the connecting plug has a plurality of pairs of the first sidewall section and the second sidewall section.

13. A semiconductor device according to claim 10, wherein the connecting plug comprises a first sidewall section having forward tapered shape, and a second sidewall section that has arcuate shape and connected to the lower end of the first sidewall section so that the cross-sectional area, which is parallel to the upper surface of the semiconductor substrate, of the connecting portion between the first sidewall section and the second sidewall section is smaller than the area of each of the upper surface and the lower surface of the connecting plug.

14. A semiconductor device according to claim 13, wherein the connecting plug further comprises a third sidewall section that has arcuate shape and connected to the lower end of the second sidewall section.

15. A semiconductor device having a plurality of semiconductor chips stacked one upon the other, wherein at least one of the semiconductor chips comprises:

a semiconductor substrate having semiconductor elements integrally formed therein;

a wiring layer formed on a surface of the semiconductor substrate;

a conductive connecting plug formed in a through-hole extending through the semiconductor substrate;

a first conductive layer formed on the connecting plug on a side of a back surface of the semiconductor substrate; and a barrier layer formed on the connecting plug on a side of a front surface of the semiconductor substrate; and wherein an interface between the connecting plug and the first conductive layer forms an acute angle with a side surface of the connecting plug connected to an interface between the connecting plug and the first conductive layer.

16. A method of manufacturing a semiconductor device, comprising:

selectively etching a semiconductor substrate from a side of a front surface of the substrate so as to form a first hole having a sidewall formed in a forward tapered shape;

forming a second hole by etching the semiconductor substrate from the side of the front surface, connected to a lower portion of the first hole and having a sidewall formed in an invertedly tapered shape in a portion connected to the first hole;

burying a conductive material in the first and second holes; and exposing the buried conductive material to a back surface of the semiconductor substrate so as to form a connecting plug made of the conductive material and extending through the semiconductor substrate.

17. A method of manufacturing a semiconductor device according to claim 16, further comprising forming a first insulating film on the surfaces of walls defining the first and second holes before the conductive material is buried in the first and second holes.

18. A method of manufacturing a semiconductor device according to claim 17, wherein the forming of the connecting plug comprises:

selectively removing the semiconductor substrate from the side of the back surface of the semiconductor substrate so as to expose the first insulating film formed on the wall defining the second hole;

forming a second insulating film on the back surface of the semiconductor substrate selectively removed; and removing the first insulating film and the second insulating film so as to expose the conductive material to the outside.

* * * * *